(12) United States Patent
Miyajima

(10) Patent No.: US 6,567,260 B1
(45) Date of Patent: May 20, 2003

(54) CAPACITOR AND SEMICONDUCTOR MEMORY

(75) Inventor: Takashi Miyajima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/134,632

(22) Filed: Apr. 30, 2002

(30) Foreign Application Priority Data

Nov. 7, 2001 (JP) ........................................ 2001-341505

(51) Int. Cl.⁷ .............................................. H01G 4/228
(52) U.S. Cl. ..................... 361/306.3; 361/311; 257/310
(58) Field of Search .................. 361/306.3, 311–313, 361/301.4, 321.2; 257/300, 303, 306, 310 301, 295

(56) References Cited

U.S. PATENT DOCUMENTS 5,110,752 A * 5/1992 Lu .............................. 257/309
5,266,514 A * 11/1993 Tuan et al. .................. 438/255
5,641,702 A * 6/1997 Imai et al. ................ 257/29.15
6,303,430 B1 * 10/2001 Jenq ........................... 438/253

FOREIGN PATENT DOCUMENTS

JP 2000-22098 1/2000

* cited by examiner

Primary Examiner—Anthony Dinkins
(74) Attorney, Agent, or Firm—Oblon, Spivak, McClelland, Maier & Neustadt, P.C.

(57) ABSTRACT

In order to reduce a leakage current of a storage node (120), a rough semiconductor film (108) provided in the storage node (120) includes a portion (108*a*) forming a side face of the storage node (120) and a portion (108*b*) forming a bottom of the storage node (120). Each of particles contributing to the roughness of the portion (108*b*) forming the bottom of the storage node (120) has a diameter smaller than a diameter of each of particles contributing to the roughness of the portion (108*a*) forming the side face of the storage node (120).

3 Claims, 13 Drawing Sheets

F I G. 2
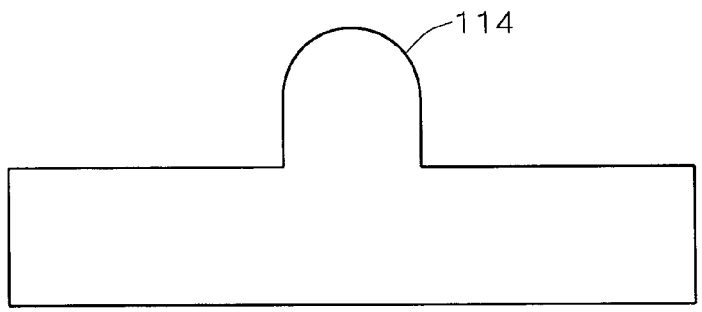
F I G. 3
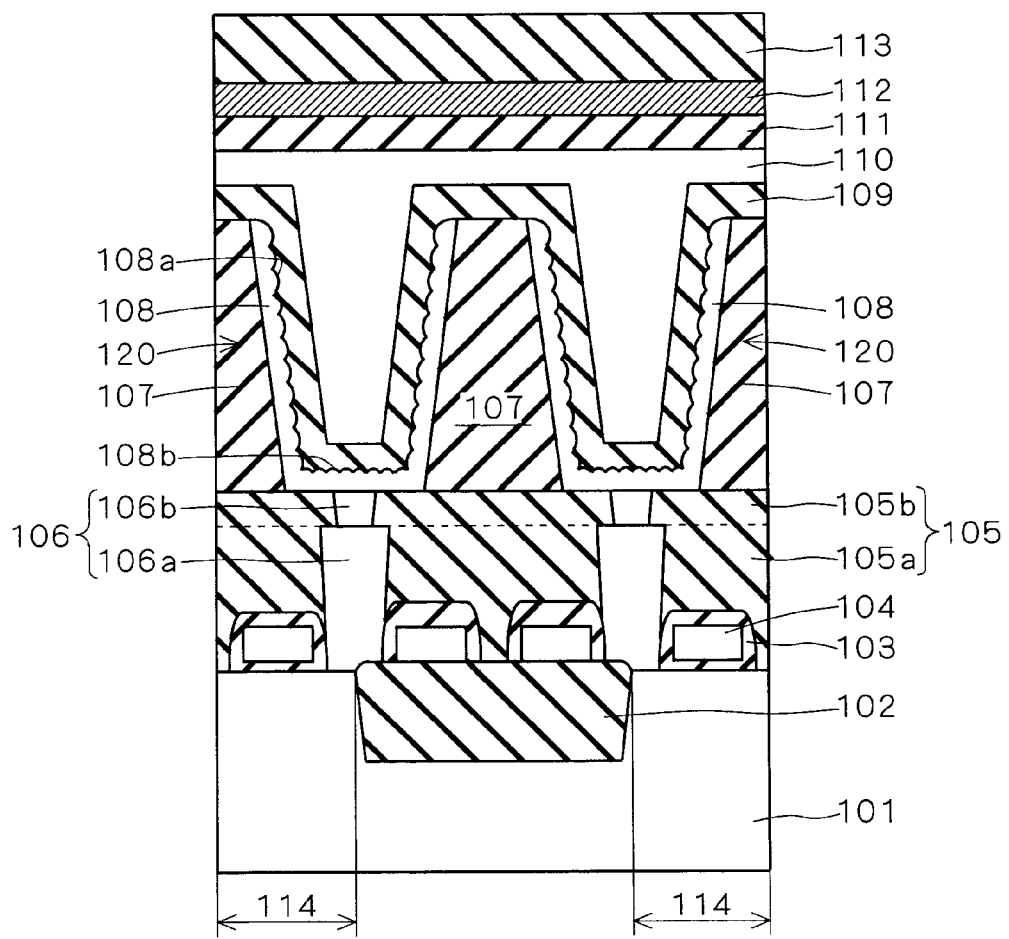

F I G. 9
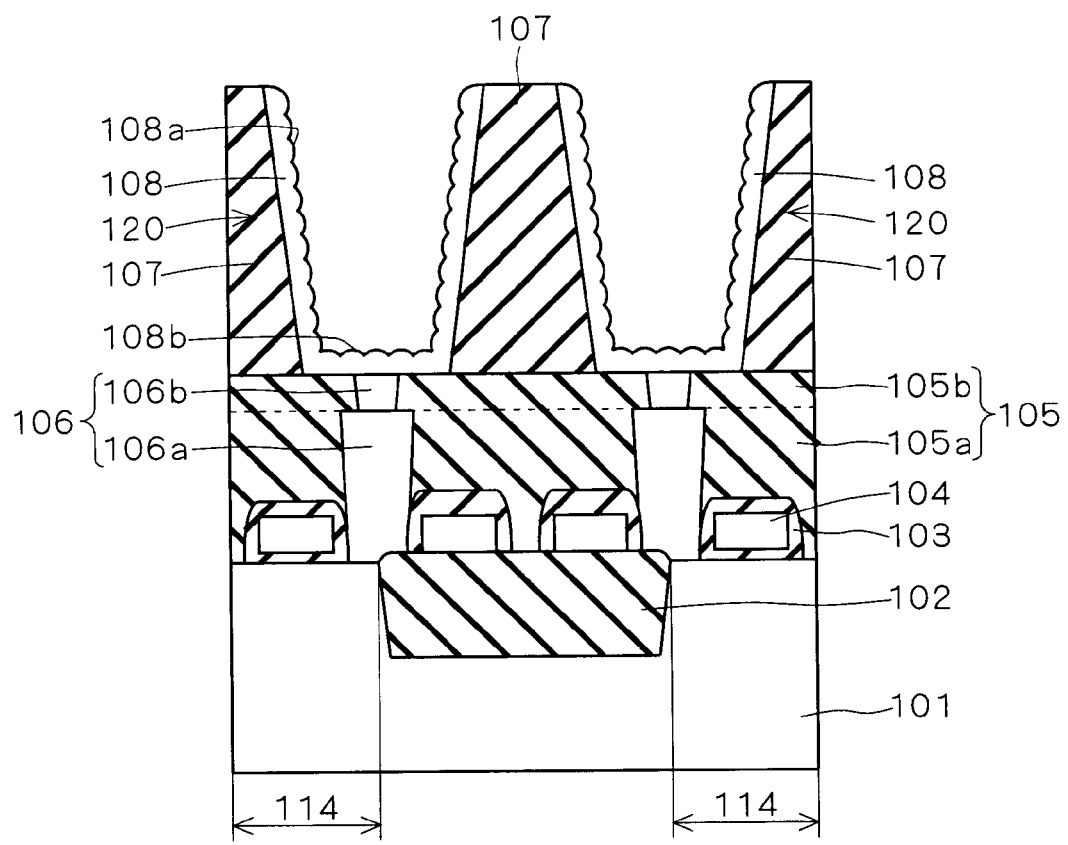

F I G. 12
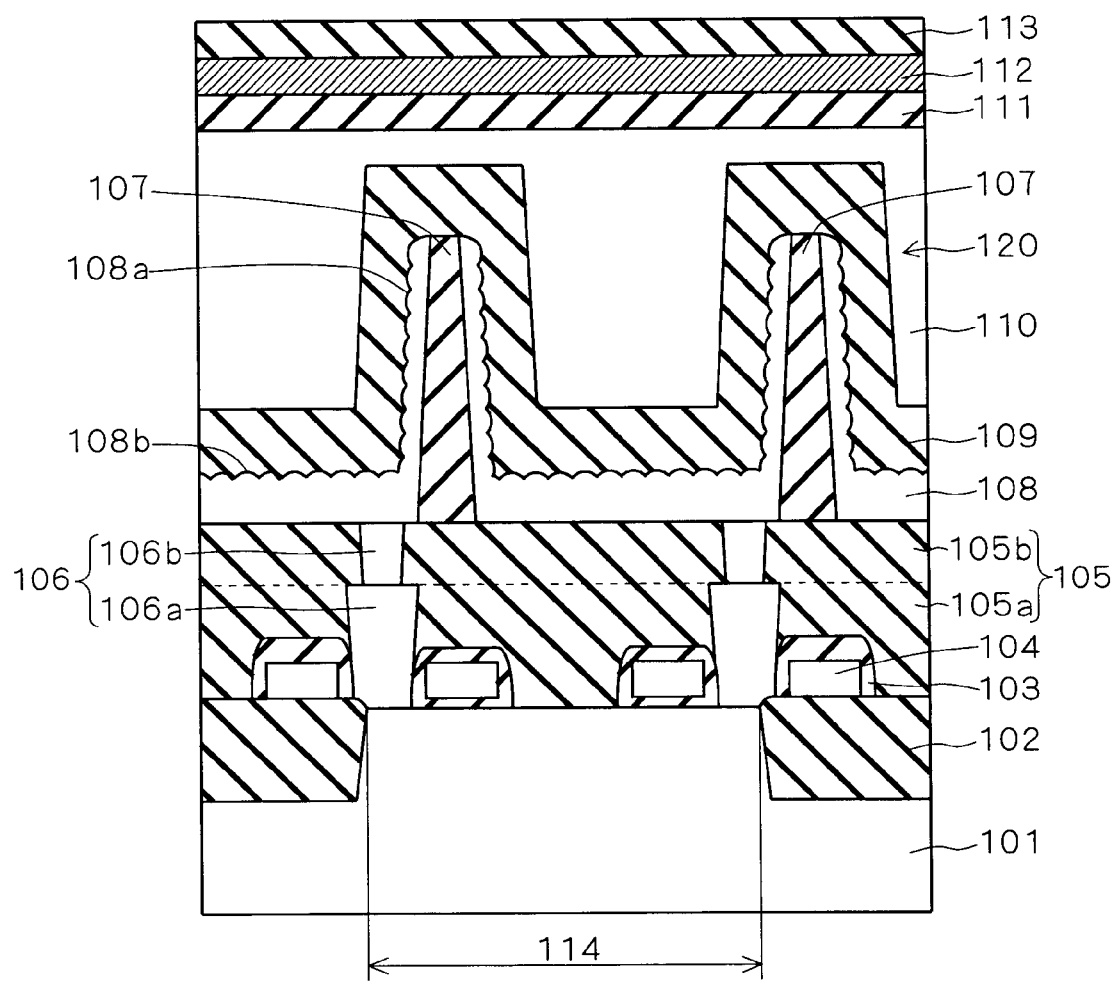

F I G. 13
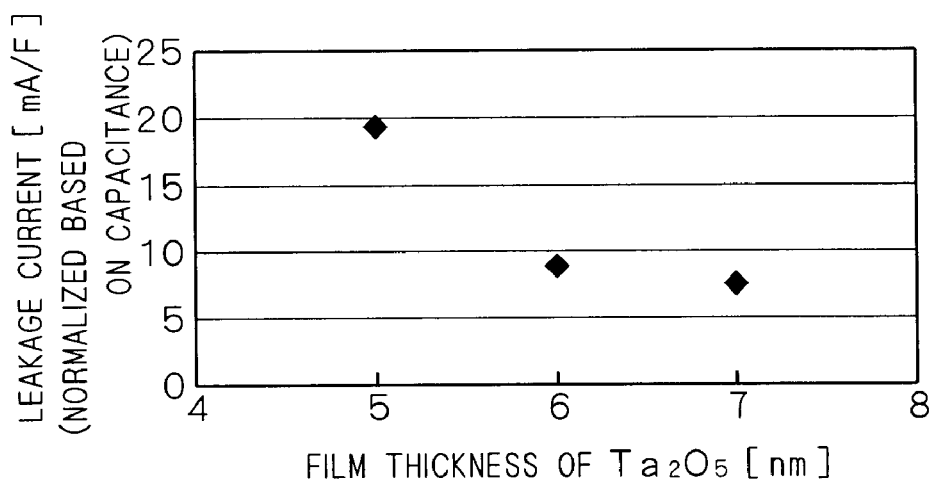

CAPACITOR AND SEMICONDUCTOR MEMORY

BACKGROUND OF THE INVENTION

1. Field of the Invention

The present invention relates to a capacitor, and is applicable to a capacitor as a storage node of a semiconductor memory, for example.

2. Description of the Background Art

As the integration density of a device has increased, a chip size has decreased. Accordingly, each size of storage nodes of a semiconductor memory, as well as each interval between the storage nodes, has been reduced. In developing a DRAM with a chip of a small size, it is required that a capacitor have an increased capacitance.

To meet the foregoing requirement, various attempts have been made, including: increasing an aspect ratio of a hole in which a storage node is to be formed (hereinafter, referred to as a "storage node hole"); increasing the dielectric constant of a dielectric film used for storing an electric charge in a storage node (hereinafter, referred to as a "capacitor dielectric film"); and reducing the thickness of a capacitor dielectric film. As one example of such capacitor dielectric film, a $Ta_2O_5$ film has been proposed.

FIG. 14 is a schematic view showing an example of a structure of a conventional DRAM. An isolating oxide film 102 is provided in a surface of a semiconductor substrate 101 of silicon, for example, and partitions an element region 114. Further, a gate wiring 104 which is surrounded by an insulative gate surrounding film 103 and functions as a transfer gate is provided on a surface of the isolating oxide film 102 and an exposed surface of the semiconductor substrate 101. The gate wiring 104 extends in a direction perpendicular to the plane of the drawing. The gate surrounding film 103 shown in FIG. 14 includes a gate insulating film provided under the gate wiring 104 in the element region 114. Meanwhile, a source/drain region provided in the surface of the semiconductor substrate 101 in the element region 114 is omitted in the drawing.

A first interlayer insulating film 105 has a bilayer structure formed of layers 105a and 105b. A conductive connection part 106 is formed of a plug 106a and a landing pad 106b. The connection part 106 passes through the first interlayer insulating film 105 and connects the element region 114 to a rough semiconductor film 108 which has a rough surface and functions as one of opposite electrodes of a storage node 120.

A partition wall 107 for forming a storage node hole is selectively provided on the first interlayer insulating film 105. The rough semiconductor film 108 is provided both on a side face of the partition wall 107 and a surface of the first interlayer insulating film 105 which includes an exposed surface of the connection part 106.

A cell plate 110 functioning as the other of the opposite electrodes of the storage node 120 faces the rough semiconductor film 108 with a capacitor dielectric film 109 interposed therebetween. As the capacitor dielectric film 109, a $Ta_2O_5$ film can be employed. Further, a second interlayer insulating film 111, a metal interconnect layer 112 and a passivation film 113 are sequentially formed on the cell plate 110 in this order.

Increase in an aspect ratio of the storage node 120 results in increase in a possibility that the coverage of the rough semiconductor film 108 provided by the capacitor dielectric film 109 at the bottom of the storage node 120, in other words, near the surface of the first interlayer insulating film 105, is degraded. The foregoing possibility is further increased particularly when a diameter of each of particles contributing to the roughness of the rough surface of the rough semiconductor film 108 is increased in order to increase the capacitance of the storage node 120. The reason for it is that also an aspect ratio of each clearance provided by the particles in the rough surface of the rough semiconductor film 108 is increased so that the capacitor dielectric film 109 can not easily enter among the particles. A poor coverage of the rough semiconductor film 108 by the capacitor dielectric film 109 causes a problem that the amount of leakage current in the bottom of the storage node 120 is more likely to increase.

Further, there is another problem that use of a sintering process accelerates the increase of leakage current. In forming a transistor in the element region 114, it is not unusual that a heat treatment (a sintering process) at a temperature of 400° C. for 15 minutes while using a hydrogen atmosphere, for example, is performed in order to improve an interface state of an interface between the gate insulating film and a channel region of the transistor to be formed. During the heat treatment, reduction reaction of the $Ta_2O_5$ film employed as the capacitor dielectric film 109 occurs. As a result, the effective film thickness of the capacitor dielectric film 109 is reduced, which invites further increase in the amount of leakage current.

SUMMARY OF THE INVENTION

The present invention addresses the problems associated with the background art as noted above. To solve the problems, an object of the present invention is to provide a technique for reducing a leakage current of a capacitor.

According to the present invention, a capacitor includes a bottom, a side face, a first electrode, a dielectric film and a second electrode. The side face forms a storage node hole in conjunction with the bottom. The surface of the first electrode is roughened at the side face and the bottom. The surface is roughened finer at the bottom than at the side face. The second electrode faces the first electrode with the dielectric film interposed therebetween.

The first electrode at the bottom of the storage node hole is roughened fine, so that the dielectric film can easily enter among the roughness in that portion. As a result, it is possible to increase the capacitance by the roughness of the first electrode in the side face of the storage node hole, while reducing a leakage current by the roughness of the first electrode in the bottom of the storage node hole.

According to the present invention, a capacitor includes a plurality of storage nodes. Each of the plurality of storage nodes has a first electrode, a dielectric film and a second electrode. The first electrode is provided on a bottom and a side face of a storage node hole. The second electrode faces the first electrode with the dielectric film interposed therebetween. The plurality of storage nodes are arranged checkerwise in a plan view.

An aspect ratio of the storage node hole can be reduced without increasing the cell size of a memory comprising a plurality of the capacitors or necessarily reducing the capacitance. As a result, it is possible to improve a coverage of the first electrode provided by the dielectric film, thereby to reduce a leakage current.

According to the present invention, a capacitor includes a first electrode, a dielectric film and a second electrode. The first electrode is provided on a bottom and a side face of a storage node hole. The second electrode faces the first electrode with the dielectric film interposed therebetween. The dielectric film includes a $Ta_2O_5$ film having a thickness of 6 nm or larger.

The amount of leakage current normalized based on the capacitance is drastically reduced as compared with an instance where a $Ta_2O_5$ film with a thickness of 6 nm or smaller is used, even if a sintering process using a hydrogen atmosphere is performed. As a result, it is possible to ensure the effective film thickness of the dielectric film and reduce a leakage current in a semiconductor memory comprising the capacitor and a semiconductor element, as well as to suppress the interface state of the semiconductor element.

This and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are plan views of a structure of a semiconductor memory according to a first preferred embodiment of the present invention.

FIGS. 3 and 4 are sectional views of the structure of the semiconductor memory according to the first preferred embodiment of the present invention.

FIG. 9 is a sectional view for illustrating a method of manufacturing a semiconductor memory according to a third preferred embodiment of the present invention.

FIGS. 11 and 12 are sectional views of the structure of the semiconductor memory according to the fourth preferred embodiment of the present invention.

FIG. 13 is a graph showing a feature of a semiconductor memory according to a fifth preferred embodiment of the present invention.

DESCRIPTION OF THE PREFERRED EMBODIMENTS

First Preferred Embodiment

Figure 1:
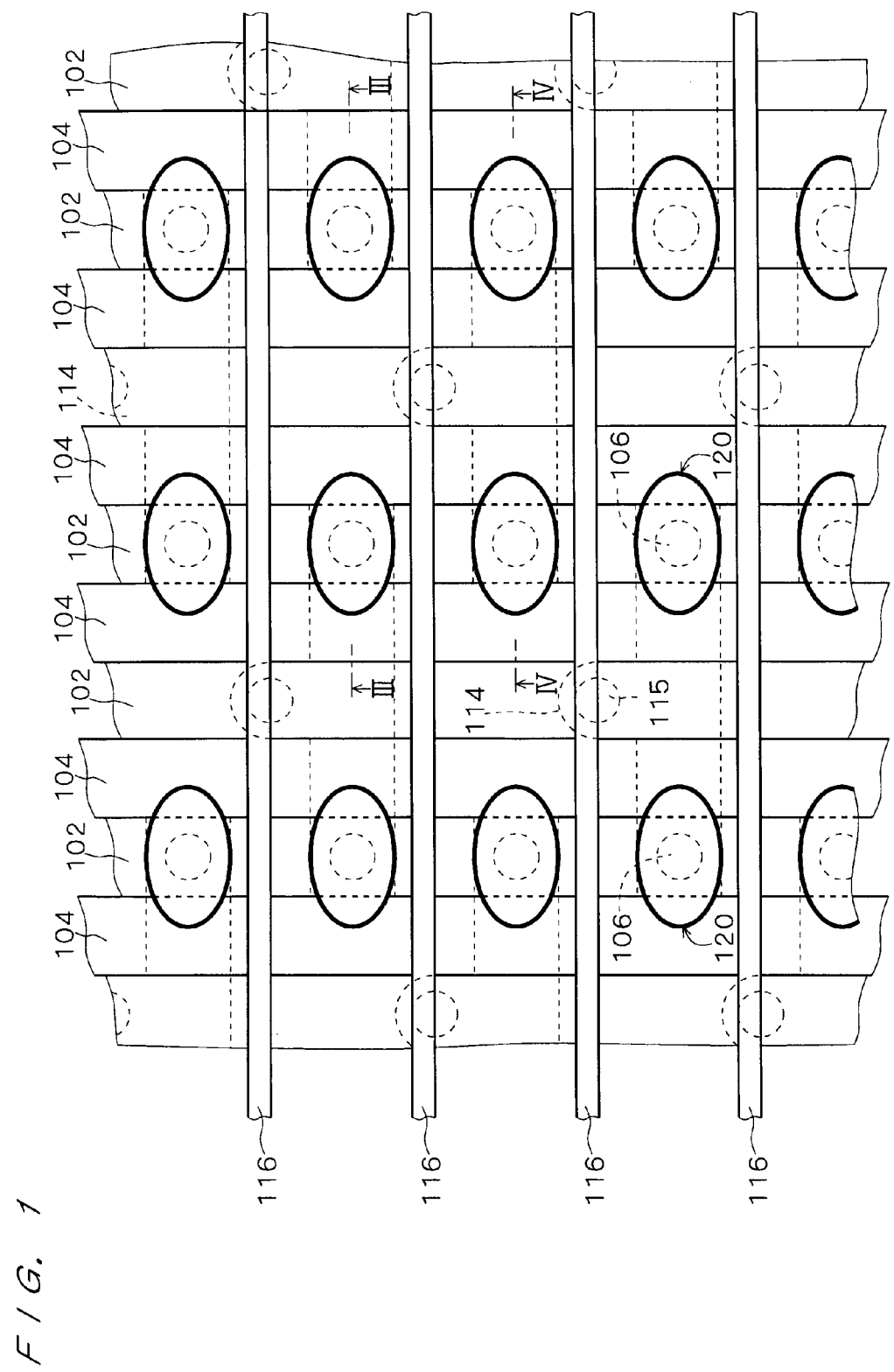
Figure 4:
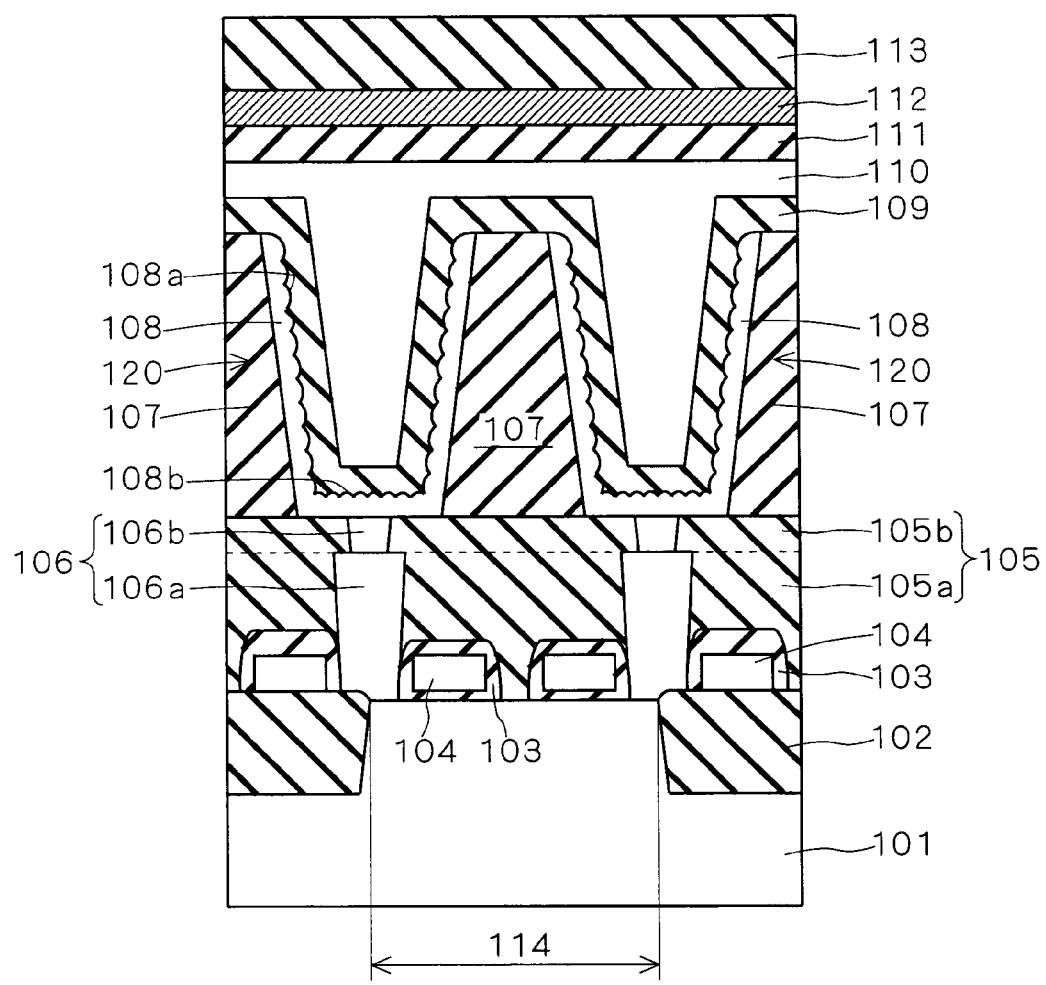
Figure 5:
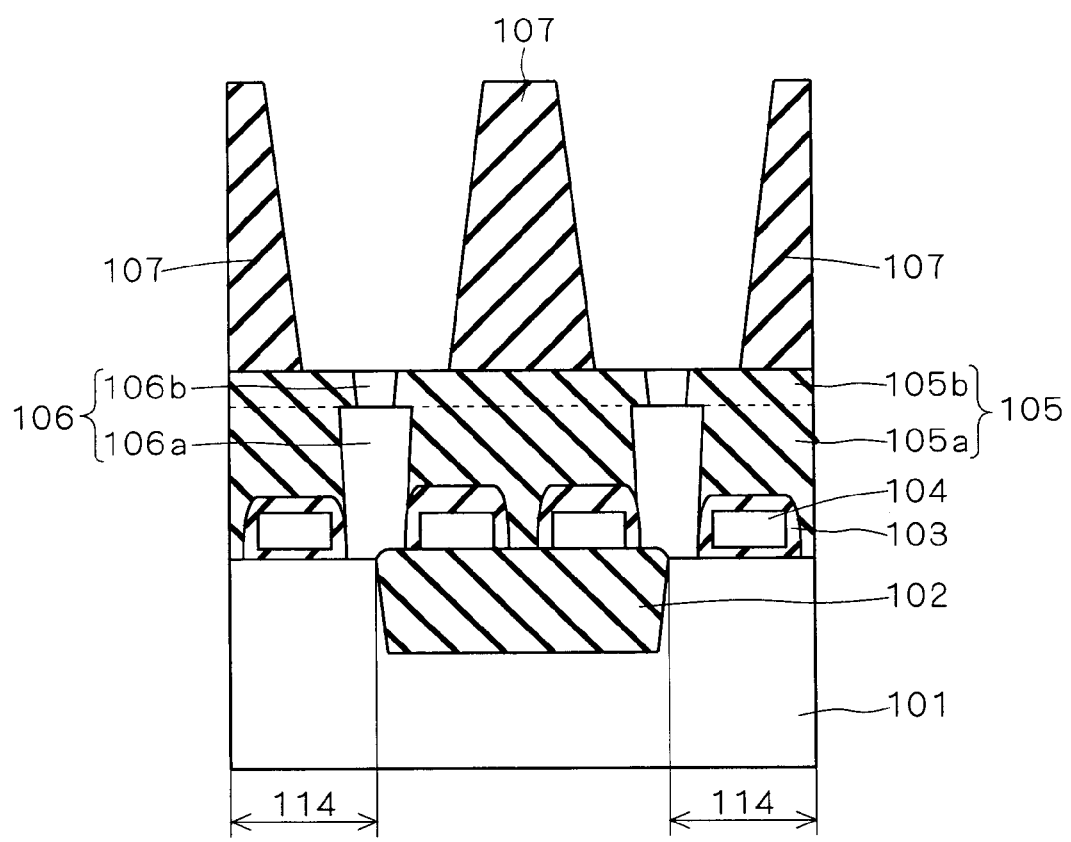
FIGS. 5 to 8 are sectional views for sequentially illustrating a method of manufacturing a semiconductor memory according to a second preferred embodiment of the present invention.

FIG. 1 is a plan view showing an example of a structure of a DRAM as a semiconductor memory according to the present embodiment. FIG. 3 is a vertical sectional view of the structure in FIG. 1 taken along a line III—III of FIG. 1. FIG. 4 is a vertical sectional view of the structure in FIG. 1 taken along a line IV—IV of FIG. 1.

An isolating oxide film 102 is selectively provided in a surface of a semiconductor substrate 101 of silicon, for example. The isolating oxide film 102 partitions an element region 114 in which a transistor is to be formed in the semiconductor substrate 101. It is noted that a source/drain region which should be included in the transistor to be formed in the element region 114 is omitted in the drawings. Further, FIG. 2 is a plan view showing an example of a shape of the element region 114.

A gate wiring 104 which is surrounded by an insulative gate surrounding film 103 and functions as a transfer gate is provided on a surface of the isolating oxide film 102 and an exposed surface of the semiconductor substrate 101. The gate wiring 104 extends in a direction perpendicular to the planes of the drawings. The gate surrounding film 103 shown in the drawings includes a gate insulating film provided under the gate wiring 104 in the element region 114.

A first interlayer insulating film 105 is provided above (, in other words, over a portion of the semiconductor substrate 101 on which the gate wiring 104 exists) the semiconductor substrate 101, the isolating oxide film 102, the gate surrounding film 103 and the gate wiring 104. The first interlayer insulating film 105 has a bilayer structure formed of a layer 105a and a layer 105b placed above the layer 105a. The layer 105a has a plug 106a provided therein so as to pass through the layer 105a and be connected to the element region 114. The layer 105b has a landing pad 106b provided therein so as to pass through the layer 105b and be connected to the plug 106a. Both the plug 106a and the landing pad 106b are conductive and form a connection part 106. For purposes of simplification, the plug 106a and the landing pad 106b are not clearly distinguished from each other in FIG. 1. Each of the layers 105a and 105b is formed of an oxide film which employs BPTEOS as a raw material (hereinafter, referred to as a "BPTEOS film"), for example. Each of the plug 106a and the landing pad 106b is formed of polysilicon, for example.

A partition wall 107 for forming a storage node hole is selectively provided on the first interlayer insulating film 105. A rough semiconductor film 108 which has a rough surface and functions as one of opposite electrodes of the storage node 120 is provided on both a side face of the partition wall 107 and a surface of the first interlayer insulating film 105 which includes an exposed surface of the connection part 106. The rough semiconductor film 108 as a whole presents a recess which is upwardly open. Moreover, the rough semiconductor film 108 is connected to the element region 114 via the connection part 106.

If the semiconductor substrate 101, the isolating oxide film 102, the gate surrounding film 103, the gate wiring 104, the first interlayer insulating film 105 and the connection part 106 are collectively referred to as a basic structure for convenience sake, the storage node 120 has a bottom which is to be electrically connected with the basic structure and a side face which forms, in conjunction with the bottom, the storage node hole. The rough semiconductor film 108 is provided in the bottom and the side face of the storage node 120.

A cell plate 110 functioning as the other of the opposite electrodes of the storage node 120 faces the partition wall 107 and the rough semiconductor film 108 with a capacitor dielectric film 109 interposed therebetween. As the capacitor dielectric film 109, a $Ta_2O_5$ film can be employed, for example. The cell plate 110 includes projection parts each fit in the recess presented by the rough semiconductor film 108 and a joint part for jointing the projection parts above the partition wall 107.

A second interlayer insulating film 111, a metal interconnect layer 112 and a passivation film 113 are sequentially formed on the cell plate 110 in this order. It is noted that the rough semiconductor film 108, the capacitor dielectric film 109, the cell plate 110 and the metal interconnect layer 112 and the passivation film 113 are omitted in FIG. 1, for purposes of simplification.

Moreover, while FIG. 1 shows a bit line 116 and a bit line contact 115 connecting the element region 114 and the bit line 116, FIGS. 3 and 4 which are sectional views of FIG. 1 do not show the bit line 116 and the bit line contact 115. Also, description about a structure for connecting the bit line 116 and the bit line contact 115, as well as connecting the element region 114 and either the bit line 116 or the bit line contact 115, which is irrelevant to the essence of the present invention, is omitted.

According to the present embodiment, each of particles contributing to the roughness of a portion 108b of the rough semiconductor film 108 which is placed on the surface of the first interlayer insulating film 105 (i.e., a portion corresponding to the bottom of the storage node 120) has a diameter smaller than that of each of particles contributing to the roughness of the portion 108a of the rough semiconductor film 108 which is placed on the side face of the partition wall 107 (i.e., a portion corresponding to the side face of the storage node 120). For example, a quotient of the diameter of each particle associated with the roughness of the portion 108a divided by the diameter of each particle associated with the roughness of the portion 108b is approximately 2–3. More specifically, each particle associated with the roughness of the portion 108a has a diameter of 80 nm, while each particle associated with the roughness of the portion 108b has a diameter of 30 nm, for example. As a matter of course, sizes of the particles actually shown in FIGS. 3 and 4 for illustrating the rough surface of the rough semiconductor film 108 are diagrammatic, merely indicating the existence of difference in particle diameter between the portions 108a and 108b, and not to scale with the other components shown therein.

According to the present embodiment, the roughness of the portion 108b is finer than that of the portion 108a. More correctly, the diameter of each of the particles contributing to the roughness of the portion 108b is small, which makes it easy for the capacitor dielectric film 109 to enter among the particles of the portion 108b. Hence, it is possible to increase the capacitance of the storage node 120 by including the portion 108a on the one hand, while reducing a leakage current by including the portion 108b on the other.

Second Preferred Embodiment

The present embodiment describes a method of manufacturing the semiconductor memory described in the first preferred embodiment. FIGS. 5–8 illustrate a method of manufacturing a semiconductor memory according to the present embodiment in order of occurrence of respective steps. FIGS. 5–8 are vertical sectional views of the structure of FIG. 1 taken along the line III—III of FIG. 1, which are in the course of respective manufacturing steps. By employing a suitable method including a conventional method, the semiconductor substrate 101, the isolating oxide film 102, the gate surrounding film 103, the gate wiring 104, the first interlayer insulating film 105, the connection part 106 and the partition wall 107 are formed to obtain a structure shown in FIG. 5. Formation of the partition wall 107 includes , as one example citable here, steps of: forming a BPTEOS film so as to have a thickness of 1800 nm; performing a resist patterning process using a photoresist; and performing a dry etching process in the known manner typically applied to an oxide film to obtain a desired shape.

Figure 6:
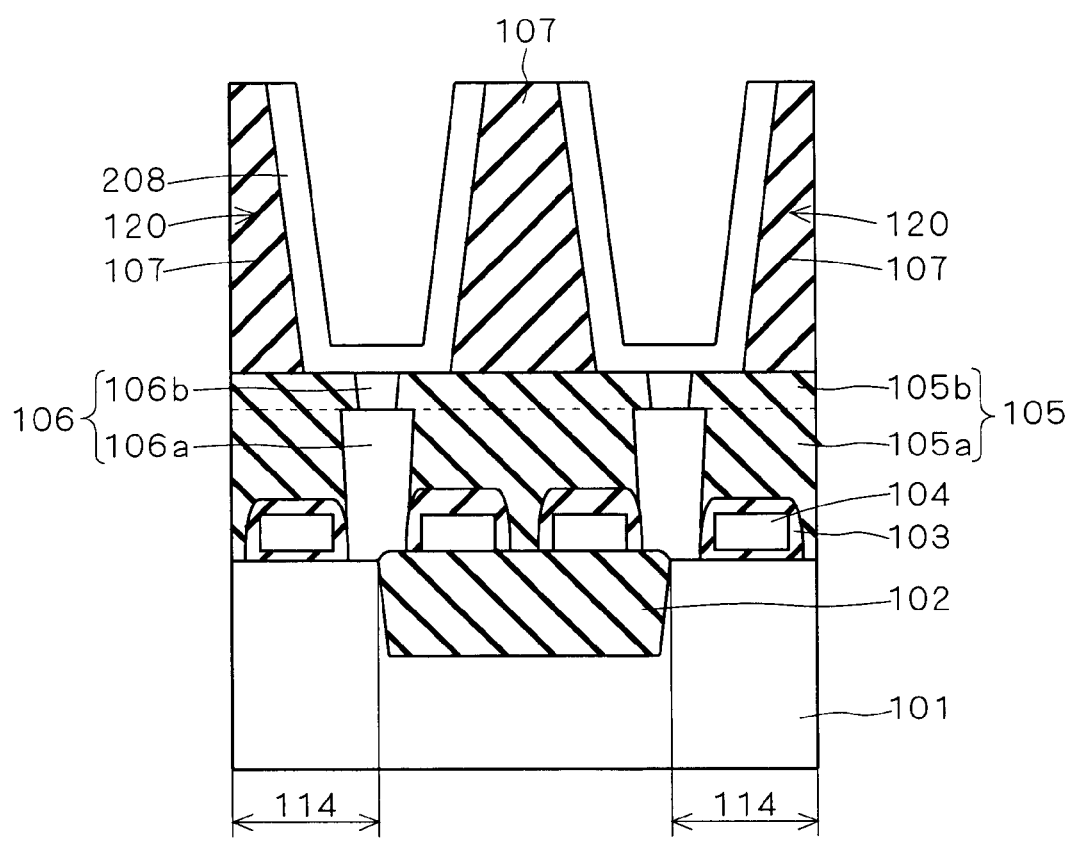
Figure 7:
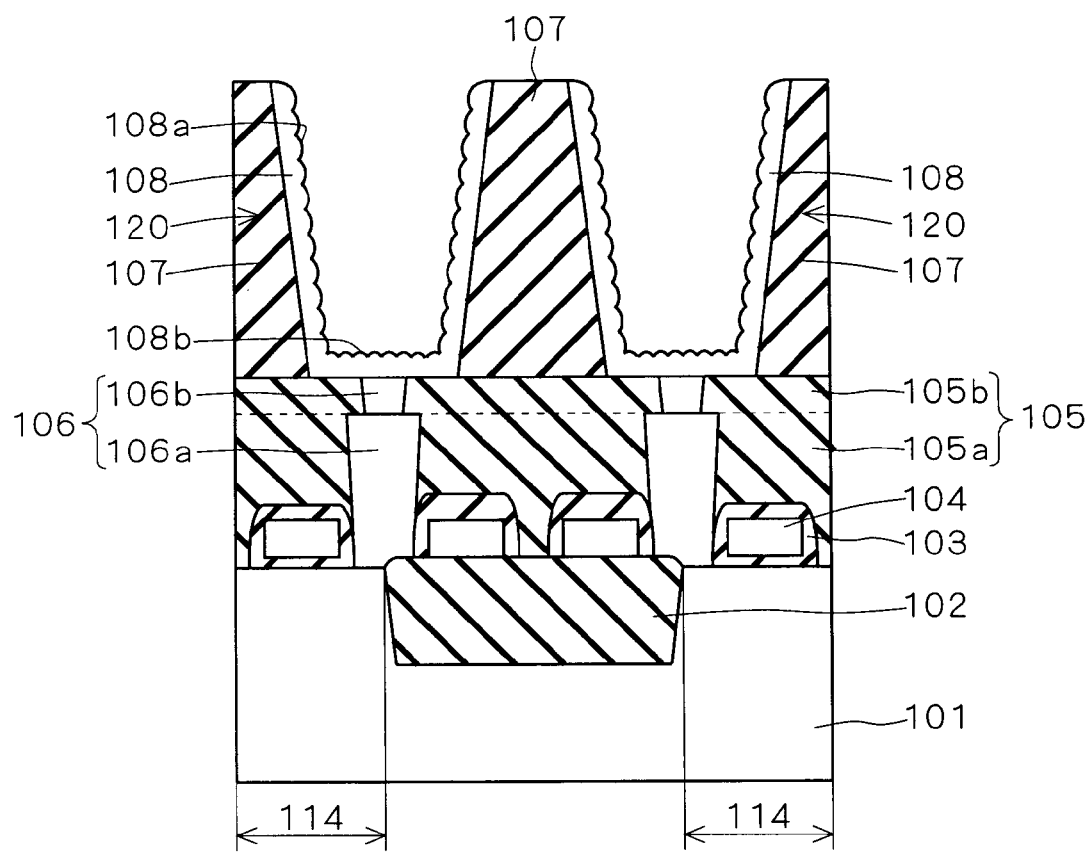

Thereafter, the rough semiconductor film 108 having a rough surface is formed. More specifically, for example, a film of doped polysilicon is formed so as to have a thickness of 25 nm, and subsequently, a film of amorphous silicon is formed so as to have a thickness of 20 nm, thereby to form a semiconductor film 208. As a result, a structure shown in FIG. 6 is obtained. Then, a disilane ($Si_2H_6$) gas as a material for producing silicon is flown in a high vacuum (of approximately $1.33 \times 10^{-6}$ Pa) at a flow rate of $4 \times 10^{-2}$ liter per second. During this flow of gas, the entire structure is heated to a temperature of 750° C. using a lamp from above the side face toward the bottom of the storage node 120. By the foregoing heat treatment, the surface of the semiconductor film 208 is roughened, to complete the rough semiconductor film 108, thereby to obtain a structure shown in FIG. 7.

As a result of the foregoing heat treatment in which the entire structure is heated from above using the lamp, the temperature of the surface of the first interlayer insulating film 105 becomes lower than that of the side face of the partition wall 107. Accordingly, silicon contained in an upper portion of the storage node hole is roughened at a speed greater than a speed at which silicon contained in the bottom of the storage node hole is roughened. Hence, each of the particles in the portion 108b of the rough semiconductor film 108 has a diameter smaller than that of the particles in the portion 108a of the rough semiconductor film 108. For example, each of the particles in the side face of the storage node 120, especially at an upper portion thereof, has a diameter of approximately 80 nm, while each of the particles in the bottom of the storage node 120 has a diameter of approximately 30 nm.

Figure 8:
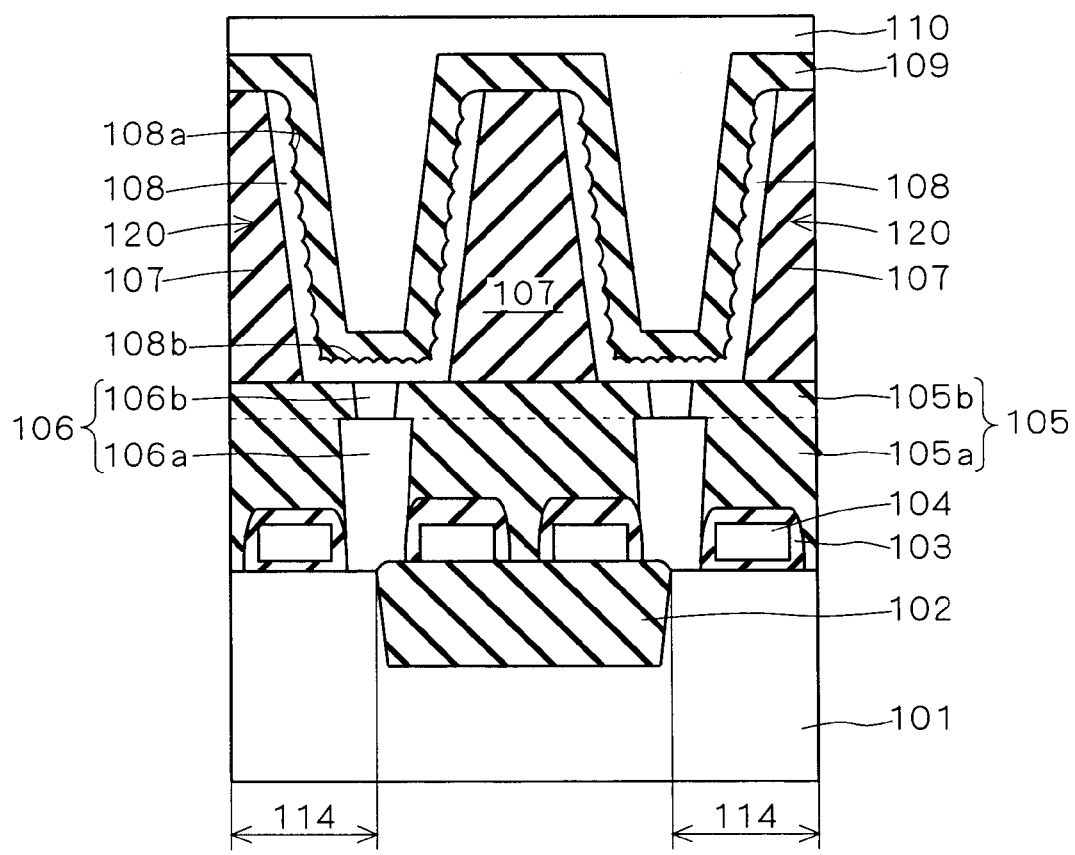

Thereafter, a $Ta_2O_5$ film is formed so as to have a thickness of 6.5 nm on the rough semiconductor film 108, and subsequently, the formed $Ta_2O_5$ film is heated in an oxygen atmosphere. Then, an oxidation process is performed on the $Ta_2O_5$ film using an $O_3$ gas at a temperature of 660° C., for example, to crystallize the film. As a result, the capacitor dielectric film 109 with a thickness of approximately 4 nm is formed. Further, a TiN film is formed to form the cell plate 110. In this manner, a structure shown in FIG. 8 is obtained.

Further, an additional BPTEOS film is formed as the second interlayer insulating film 111. Also, an aluminum film is formed, and a patterning process is performed on the formed aluminum film, to form the metal interconnect layer 112. Thereafter, a plasma nitride film is formed as the passivation film 113.

Still further, a sintering process is performed using a hydrogen atmosphere at a temperature of 400° C. for 15 minutes, in order to improve an interface state of an interface between the gate insulating and the channel region of the transistor not shown. As a result, the semiconductor memory described in the first embodiment is completed.

Third Preferred Embodiment

The present embodiment describes another method of manufacturing the semiconductor memory described in the first preferred embodiment. By employing a suitable method including the conventional method, the semiconductor substrate 101, the isolating oxide film 102, the gate surrounding film 103, the gate wiring 104, the first interlayer insulating film 105, the connection part 106 and the partition wall 107 are formed. Further, the semiconductor film 208 is formed by following the steps described in the second preferred embodiment (FIG. 6). Then, a disilane ($Si_2H_6$) gas is flown in a high vacuum (of approximately $1.3 \times 10^{-6}$ Pa) at a flow rate of $4 \times 10^{-2}$ liter per second. During the flow of gas, the entire structure is heated from below the semiconductor substrate 101 using a resistive heating method. As a result, the rough semiconductor film 108 containing particles each having a diameter of approximately 80 nm in both the portions 108a and 108b therein is formed, thereby to obtain a structure shown in FIG. 9.

Thereafter, an anisotropic etching process using a chloric gas is performed on the rough semiconductor film 108 in the known manner typically applied to silicon. Because of the anisotropy of the etching process as performed, the portion 108b is etched more than the portion 108a. Accordingly, each of the particles of the portion 108b has a diameter smaller than that of the portion 108a.

After that, the same processes as described in the second preferred embodiment can be applied.

Fourth Preferred Embodiment

A better coverage of the rough semiconductor film 108 provided by the capacitor dielectric film 109 can be achieved by reducing an aspect ratio of the storage node hole. However, reduction in the height of the storage node 120 (i.e., a dimension of the storage node 120 along a direction of the thickness of the semiconductor substrate 101) results in reduction in the area of the side face of the partition wall 107. This in turn reduces the capacitance of the storage node 120. On the other hand, as an alternative to the reduction of the height of the storage node 120 in an attempt to reduce the aspect ratio of the storage node hole, the opening of the storage node 120 may be increased. However, this alternative causes a disadvantage of increasing the cell size of the semiconductor memory to reduce the integration density so long as the arrangement of storage nodes 120 as shown in FIG. 1 is employed. In view of this, according to the present embodiment, the storage nodes 120 are arranged checkerwise, which allows the opening of the storage node 120 to increase without altering the cell size.

Figure 10:
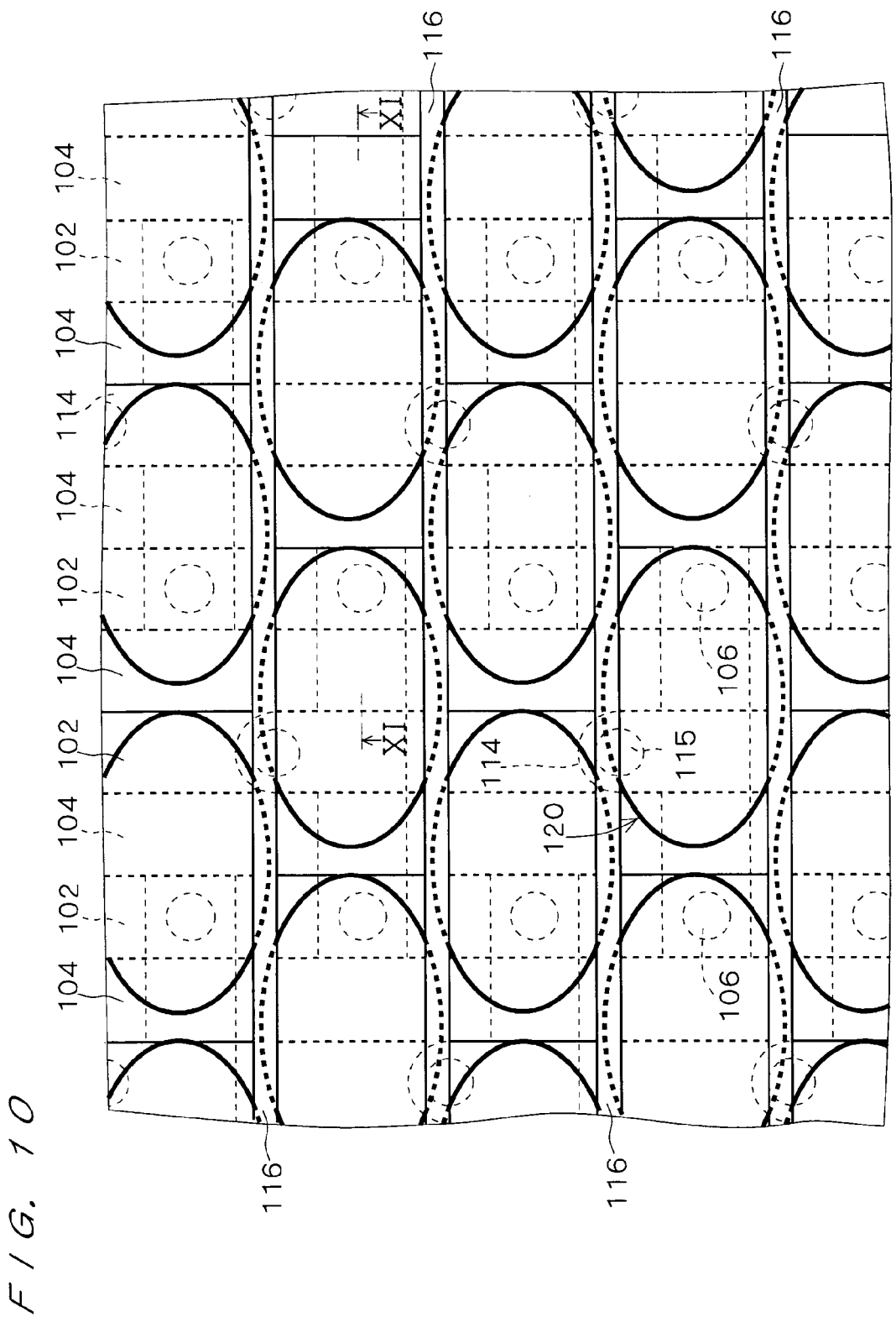
FIG. 10 is a plan view of a structure of a semiconductor memory according to a fourth embodiment of the present invention.
Figure 11:
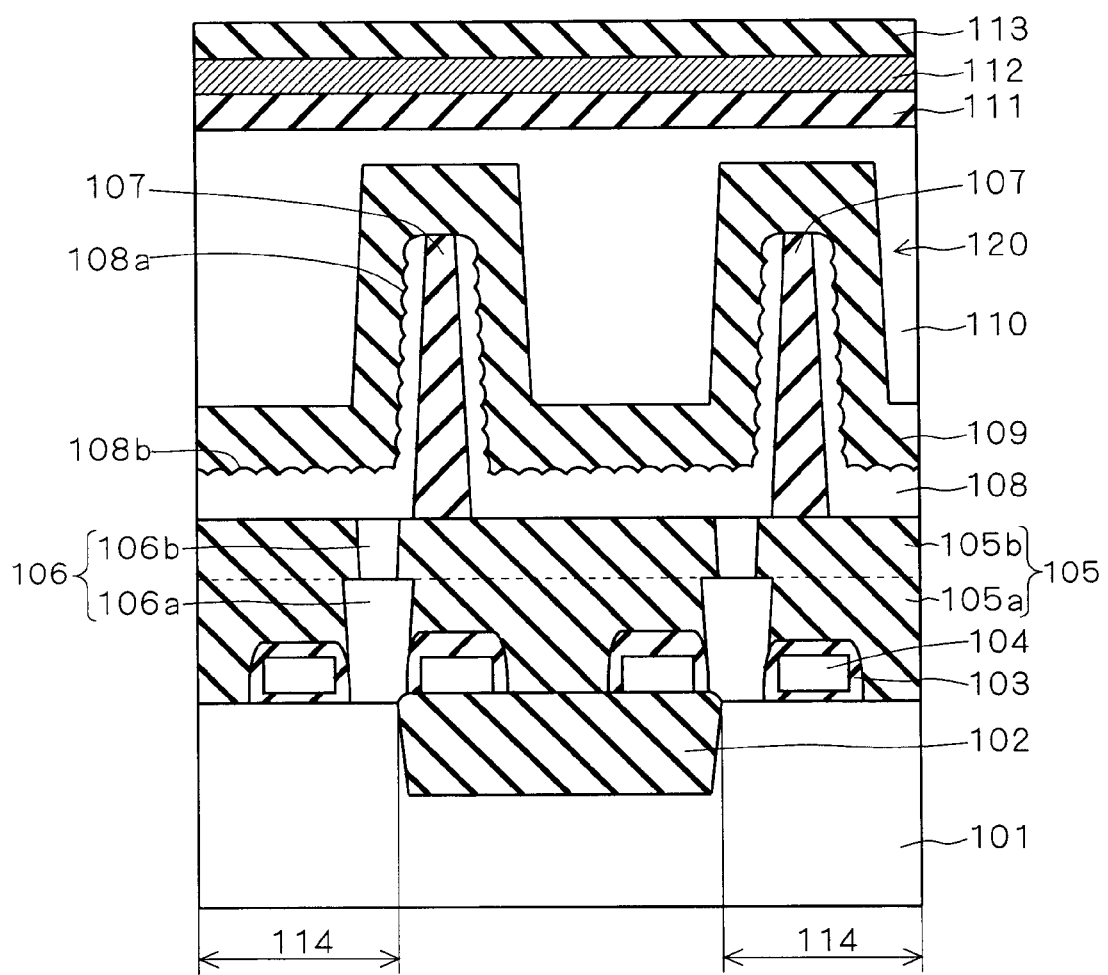
Figure 14:
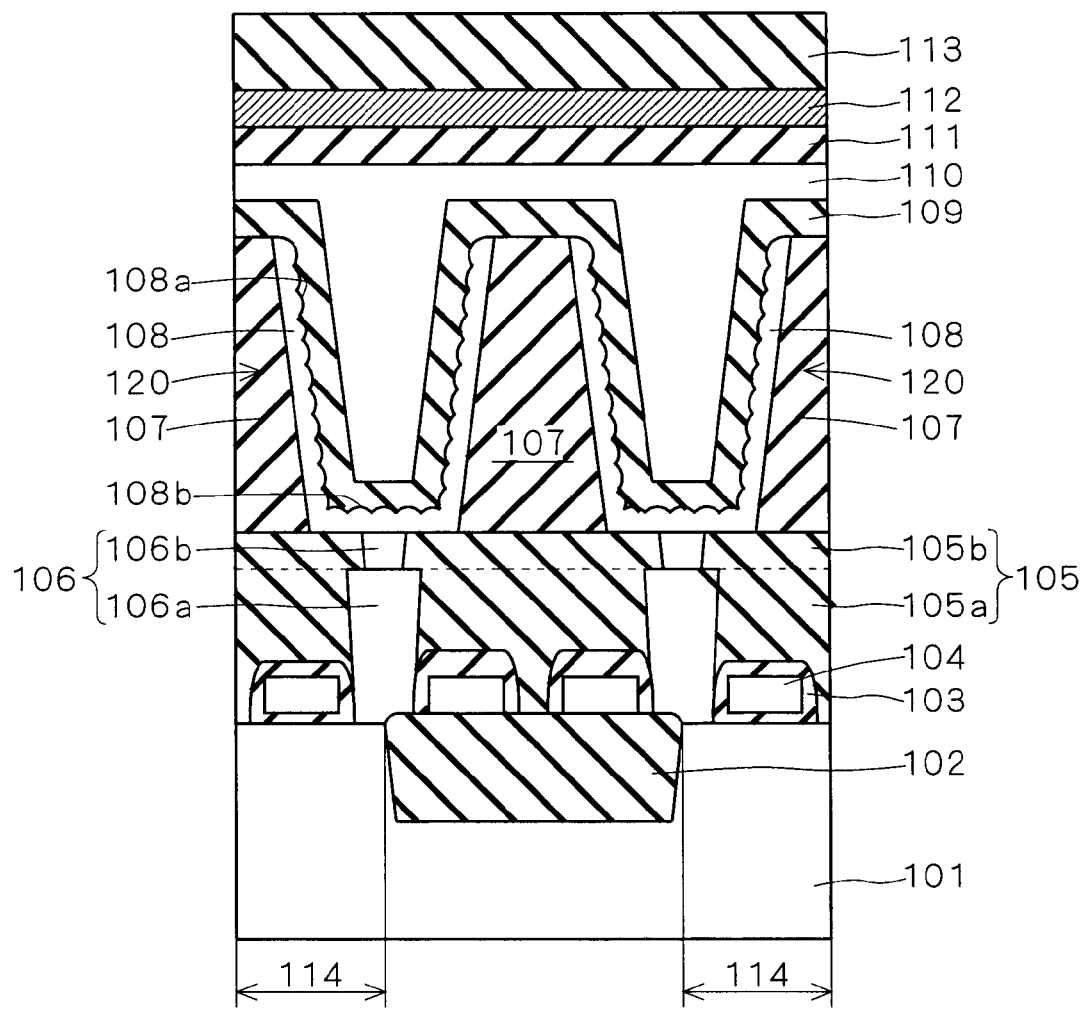
FIG. 14 is a sectional view of a structure of a semiconductor memory according to the background art.

FIG. 10 is a plan view showing an example of a structure of a DRAM as a semiconductor memory according to the present embodiment. FIG. 11 is a vertical sectional view of the structure shown in FIG. 10 taken along a line XI—XI of FIG. 10. FIG. 12 is a vertical sectional view of the structure of FIG. 10 taken along a line XII—XII of FIG. 10. Like the first preferred embodiment, the element region 114 in the present embodiment has the shape shown in FIG. 2.

In accordance with a general cell size of a DRAM, a dimension of a cell along a direction in which the bit line 116 extends is relatively large, and a dimension of a cell along a direction in which the gate wiring 104 extends is relatively small. Similarly to the general size, also the storage node 120 shown in FIG. 1 and its corresponding embodiment has a shape in which a dimension along the direction in which the bit line 116 extends is relatively large while a dimension along the direction in which the gate wiring 104 extends is relatively small.

In contrast, according to the present embodiment in which the storage nodes are arranged checkerwise, it is possible to increase the dimension of the storage node 120 along the direction in which the gate wiring 104 extends. Prior to the present invention, an aspect ratio of the storage node 120 along the direction in which the gate wiring 104 extends was high. However, as a result of the checkerwise arrangement of the storage nodes, the dimension of the storage node 120 along the direction in which the gate wiring 104 extends can be lengthened. This can improve the coverage of the rough semiconductor film 108 provided by the capacitor dielectric film 109. As a result, a leakage current can be reduced.

Fifth Preferred Embodiment

The present embodiment describes a technique for compensating the reduction reaction of the $Ta_2O_5$ film which is caused by the sintering process using a hydrogen atmosphere. According to the present embodiment, the $Ta_2O_5$ film functioning as the capacitor dielectric film 109 is prepared so as to be relatively thick, thereby to reduce a leakage current which occurs due to reduction in the effective film thickness of the capacitor dielectric film 109 on which the sintering process has been performed.

By employing a suitable method including the conventional method or the methods described in the second and third preferred embodiments, the semiconductor substrate 101, the isolating oxide film 102, the gate surrounding film 103, the gate wiring 104, the first interlayer insulating film 105, the connection part 106, the partition wall 107 and the rough semiconductor film 108 are formed. In the present embodiment, each of the particles of the portion 108a and each of the particles of the portion 108b can have the substantially same diameter. However, it is preferable that each of the particles of the portion 108b has a diameter smaller than that of the portion 108a as in the first preferred embodiment, for purposes of reducing a leakage current.

According to the present embodiment, the capacitor dielectric film 109 is formed so as to have a thickness of 7 nm, for example. Formation of the capacitor dielectric film 109 with the foregoing thickness includes the following steps. First, a $Ta_2O_5$ film is formed so as to have a thickness of 10 nm. Next, the formed $Ta_2O_5$ film is heated in an oxygen atmosphere so that the $Ta_2O_5$ film is oxidized using an $O_3$ gas at a temperature of 660° C., for example. As a result, the $Ta_2O_5$ film is crystallized to obtain the capacitor dielectric film 109. The crystallization allows for formation of the capacitor dielectric film 109 having approximately two-thirds of the thickness of the $Ta_2O_5$ film as initially formed.

It is preferable that the capacitor dielectric film 109 has a small thickness for purposes of increasing the capacitance of the storage node 120 on one hand. However, there is a preferable lower limit upon the thickness of the capacitor dielectric film 109 for purposes of reducing a leakage current, on the other hand. FIG. 13 is a graph plotted to show a relationship between the film thickness of the $Ta_2O_5$ film as crystallized and the amount of leakage current. It is noted that the amount of leakage current is normalized based on the capacitance of the storage node 120. Meanwhile, the sintering process is performed under conditions that the temperature is set to 400° C., the process time is set to 15 minutes, and a hydrogen atmosphere is used.

As readily appreciated from FIG. 13, the amount of leakage current drastically reduces when the thickness of the $Ta_2O_5$ film as crystallized becomes equal to, or larger than, 6 nm. For instance, the amount of leakage current flowing when the $Ta_2O_5$ film has a thickness of 6 nm is a half of the amount of leakage current flowing when the $Ta_2O_5$ film has a thickness of 5 nm. As such, it is preferable to the capacitor dielectric film 109 has a thickness of 6 nm or larger. It follows that the $Ta_2O_5$ film is initially formed so as to have a thickness of 9 nm or larger, preferably.

As is made clear from the foregoing explanation, the reduction of the effective film thickness of the capacitor dielectric film 109 which is caused by the sintering process can be compensated. Therefore, it is possible to determine the conditions for the sintering process so as to allow for suppression of the interface state of the interface between the gate insulating film and the channel region of the transistor to be formed, though the conditions determined in such a manner are tough for the capacitor dielectric film 109. For example, the temperature set for the sintering process can be increased to 425° C., in which case the time is set to 15 minutes. Alternatively, the time set for the sintering process can be increased to 60 minutes, in which case the temperature is set to 400° C. The latter case produces a further advantage of improving the performance of the transistor, in addition to the advantage of reducing the leakage current of the capacitor.

Variations

All the first-to-fifth preferred embodiments described above provide techniques to attain a common object of reducing a leakage current. It is also preferable to properly combine the first-to-fifth preferred embodiments in an attempt to attain the common object.

For example, the first-to-third preferred embodiments contain one of the features of the present invention that each particle diameter of the portion 108b is smaller than that of the portion 108a. This feature can be incorporated into the fourth or fifth preferred embodiment. Also, another feature that the storage nodes 120 are arranged checkerwise, which is described in the fourth preferred embodiment, can be incorporated into the fifth preferred embodiment. Further, both of the above noted features of the first-to-third preferred embodiments and the fourth preferred embodiment can be incorporated into the fifth preferred embodiment, of course.

While the invention has been shown and described in detail, the foregoing description is in all aspects illustrative and not restrictive. It is therefore understood that numerous modifications and variations can be devised without departing from the scope of the invention.

What is claimed is:

1. A capacitor comprising:
   a bottom;
   a side face for forming, in conjunction with said bottom, a storage node hole;
   a first electrode, a surface of which is roughened at said side face and said bottom, said surface of said first electrode at said bottom being roughened finer than at said side face;
   a dielectric film; and
   a second electrode facing said first electrode with said dielectric film interposed therebetween.

2. A capacitor comprising a plurality of storage nodes, each of said plurality of storage nodes comprising:
   a first electrode provided on a bottom and a side face of a storage node hole;
   a dielectric film; and
   a second electrode facing said first electrode with said dielectric film interposed therebetween,
   wherein said plurality of storage nodes are arranged checkerwise in a plan view.

3. A capacitor comprising:
   a first electrode provided on a bottom and side face of a storage node hole, wherein a surface of said first electrode is roughened finer at the bottom than at the side face;
   a dielectric film; and
   a second electrode facing said first electrode with said dielectric film interposed therebetween,
   wherein said dielectric film comprises a $Ta_2O_5$ film having a thickness of 6 nm or larger.

* * * * *